(12) United States Patent
Ukawa et al.

(10) Patent No.: US 10,593,847 B2
(45) Date of Patent: Mar. 17, 2020

(54) LIGHT EMITTING DEVICE

(71) Applicant: NICHIA CORPORATION, Anan-shi, Tokushima (JP)

(72) Inventors: Hiroaki Ukawa, Tokushima (JP); Shinichi Ichikawa, Tsuru (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/473,505

(22) Filed: Mar. 29, 2017

(65) Prior Publication Data

US 2017/0288104 A1    Oct. 5, 2017

(30) Foreign Application Priority Data

Mar. 31, 2016 (JP) ................. 2016-070432

(51) Int. Cl.
| | | |
|---|---|---|
| H01L 23/28 | (2006.01) | |
| H01L 33/62 | (2010.01) | |
| H01L 33/48 | (2010.01) | |
| H01L 27/15 | (2006.01) | |
| H01L 33/54 | (2010.01) | |
| H01L 33/56 | (2010.01) | |
| H01L 33/60 | (2010.01) | |

(52) U.S. Cl.
CPC ............ *H01L 33/62* (2013.01); *H01L 27/156* (2013.01); *H01L 33/486* (2013.01); *H01L 33/54* (2013.01); *H01L 33/56* (2013.01); *H01L 33/60* (2013.01); *H01L 2224/48091* (2013.01); *H01L 2224/48095* (2013.01); *H01L 2224/48247* (2013.01); *H01L 2224/48257* (2013.01); *H01L 2224/8592* (2013.01)

(58) Field of Classification Search
CPC ..... H01L 33/62; H01L 33/483; H01L 33/486; H01L 33/54; H01L 33/60; H01L 33/56; H01L 27/156
USPC .......................................... 257/98, 100, 787
See application file for complete search history.

(56) References Cited

U.S. PATENT DOCUMENTS

| | | |
|---|---|---|
| 2009/0242927 A1 | 10/2009 | Kobayakawa et al. |
| 2010/0123156 A1 | 5/2010 | Seo et al. |
| 2011/0127566 A1 | 6/2011 | Yoon |
| 2011/0210366 A1 | 9/2011 | Seo et al. |

(Continued)

FOREIGN PATENT DOCUMENTS

| | | |
|---|---|---|
| EP | 2 187 459 A2 | 5/2010 |
| EP | 2 330 645 A2 | 6/2011 |

(Continued)

OTHER PUBLICATIONS

Extended European Search Report dated Jun. 27, 2017 in Application No. 17163854.7.

*Primary Examiner* — Nitin Parekh
(74) *Attorney, Agent, or Firm* — Foley & Lardner LLP

(57) ABSTRACT

A light emitting device includes one or more light emitting elements; a first lead on which the one or more light emitting elements are disposed; a second lead electrically connected to the one or more light emitting elements; a resin member supporting the first lead and the second lead, and including one or more projected portions; and a resin frame surrounding the light emitting elements, and covering at least a portion of each of the projected portions.

20 Claims, 11 Drawing Sheets

(56) References Cited

U.S. PATENT DOCUMENTS

| | | | |
|---|---|---|---|
| 2011/0215349 A1* | 9/2011 | An | H01L 33/486 257/89 |
| 2011/0299268 A1 | 12/2011 | Ishizaki et al. | |
| 2012/0134178 A1* | 5/2012 | Park | H01L 33/486 362/609 |
| 2013/0121000 A1* | 5/2013 | Lee | H01L 33/56 362/293 |
| 2013/0277705 A1 | 10/2013 | Seo et al. | |
| 2014/0070235 A1 | 3/2014 | Andrews et al. | |
| 2014/0103797 A1 | 4/2014 | Ishizaki et al. | |
| 2014/0197438 A1* | 7/2014 | Oh | H01L 33/486 257/98 |
| 2014/0264428 A1 | 9/2014 | Yoon | |
| 2014/0291716 A1 | 10/2014 | Ukawa | |
| 2014/0374788 A1 | 12/2014 | Seo et al. | |
| 2015/0171300 A1 | 6/2015 | Seo et al. | |
| 2015/0214455 A1 | 7/2015 | Yoon | |
| 2015/0270462 A1* | 9/2015 | Ito | H01L 33/62 257/98 |
| 2016/0005942 A1 | 1/2016 | Ukawa | |
| 2016/0035953 A1 | 2/2016 | Yoon | |
| 2016/0072032 A1 | 3/2016 | Seo et al. | |
| 2016/0372647 A1 | 12/2016 | Seo et al. | |
| 2016/0372648 A1 | 12/2016 | Yoon | |
| 2017/0279021 A1 | 9/2017 | Yoon | |
| 2018/0053885 A1 | 2/2018 | Yoon | |
| 2018/0240954 A1 | 8/2018 | Yoon | |
| 2019/0157534 A1 | 5/2019 | Yoon | |
| 2019/0245128 A1 | 8/2019 | Yoon | |

FOREIGN PATENT DOCUMENTS

| | | |
|---|---|---|
| EP | 2 369 652 A2 | 9/2011 |
| EP | 2 728 633 A2 | 5/2014 |
| EP | 2 782 150 A2 | 9/2014 |
| JP | 2004-228531 A | 8/2004 |
| JP | 2008-108836 A | 5/2008 |
| JP | 2008108836 A * | 5/2008 |
| JP | 2011-100862 A | 5/2011 |
| JP | 2011-258611 A | 12/2011 |
| JP | 2012-256651 A | 12/2012 |
| JP | 2013-206895 A | 10/2013 |
| JP | 2014-209602 A | 6/2014 |
| JP | 2015-109333 A | 6/2015 |
| JP | 2015-115407 A | 6/2015 |
| JP | 2015115407 A * | 6/2015 |
| JP | 2016-032057 A | 3/2016 |

\* cited by examiner

LIGHT EMITTING DEVICE

CROSS-REFERENCE TO RELATED APPLICATION

This application claims priority to Japanese Patent Application No. 2016-070432, filed on Mar. 31, 2016, the disclosure of which is hereby incorporated by reference in its entirety.

BACKGROUND

The present disclosure relates to a light emitting device. A light emitting device employing a light emitting element, such as a light emitting diode or laser diode, has been widely used in the areas of indoor lighting and other general lighting, automotive light sources, and liquid crystal display backlights. The performance required of such light emitting devices is becoming higher every day, and further improvements in their reliability are being sought.

Examples of the base body on which a light emitting element is mounted include a ceramic-based base body, such as alumina or aluminum nitride equipped with wiring, and a resin package integrally formed with leads. Furthermore, a light emitting device provided with a resin frame formed to surround the light emitting element mounted in a resin package that is integrally formed with the leads has been known, as disclosed in, for example, Japanese Unexamined Patent Application Publication No. 2013-206895.

SUMMARY

Further improvements in the adhesion between the resin frame and the base body are being sought. Accordingly, the object of the present disclosure is to provide a light emitting device with improved adhesion between the resin frame and the base body.

A light emitting device according to one embodiment of the present disclosure includes: one or more light emitting elements; a first lead on which the one or more light emitting elements are disposed; a second lead electrically connected to the one or more light emitting elements; a resin member supporting the first lead and the second lead, and including one or more projected portions; and a resin frame surrounding the light emitting elements, and covering at least a portion of each of the projected portions.

A light emitting device according to another embodiment of the present disclosure includes: one or more light emitting elements; a first lead including a wide-width portion on which the light emitting elements are mounted, a narrow-width portion extending from the wide-width portion and narrower than the wide-width portion, and a terminal portion extending from the narrow-width portion and being wider than the narrow-width portion; a second lead electrically connected to the light emitting elements; a resin member supporting the first lead and the second lead, and including one or more projected portions; and a resin frame surrounding the light emitting elements and covering at least a portion of each of the projected portions. The projected portions of the resin member are at least partially surrounded by the wide-width portion, the narrow-width portion, and the terminal portion.

DESCRIPTION

Figure 1:
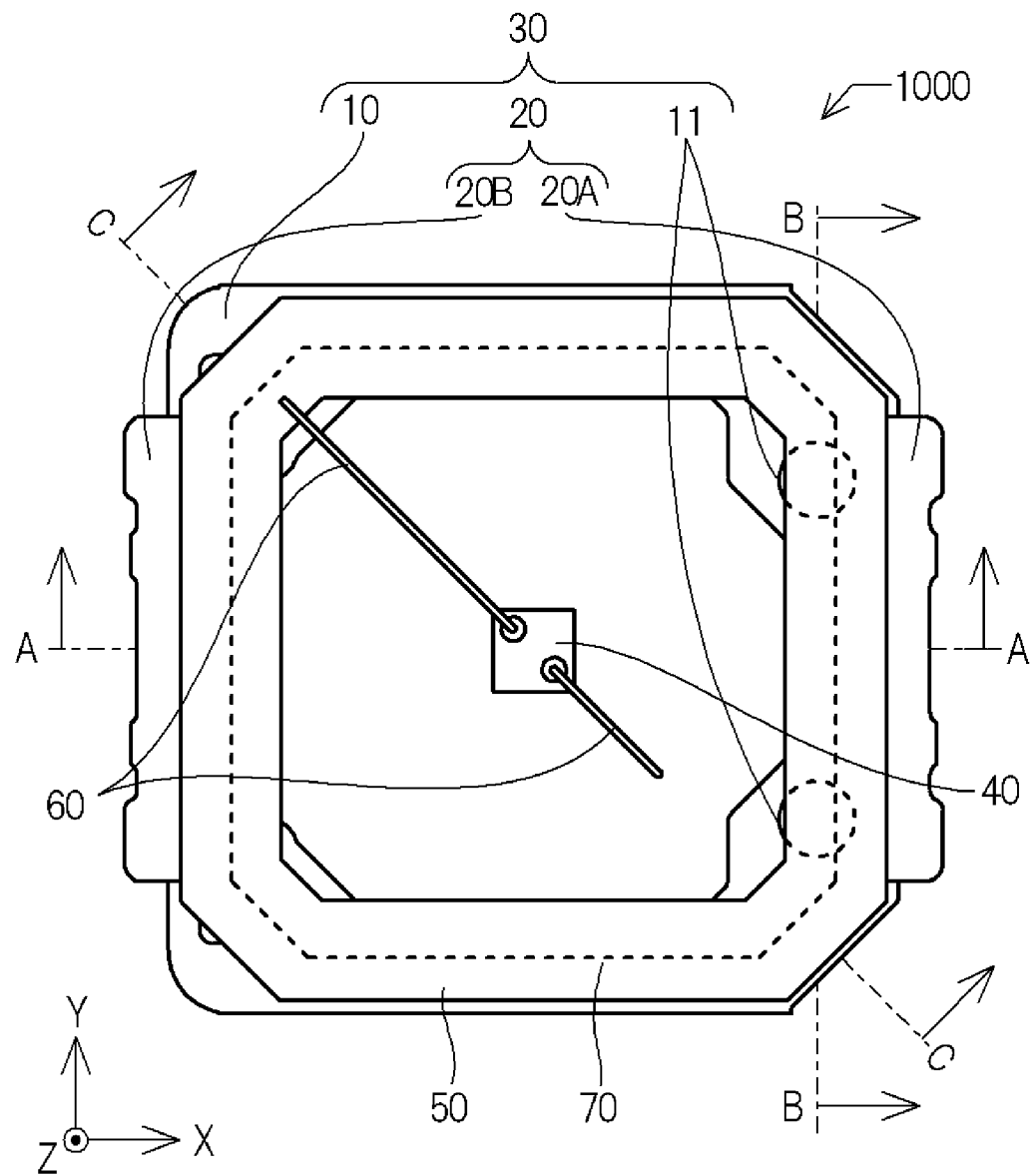
FIG. 1 is a top view of a light emitting device according to Embodiment 1 of the present disclosure.

Certain embodiments of the present disclosure will be explained below with reference to the drawings. The embodiments described below are illustrative examples of light emitting devices for the purpose of embodying the technical ideas of the present disclosure, and are not intended to limit the present disclosure to those described below.

Moreover, this patent specification does not limit the components and materials disclosed in the scope of the patent claims to those described in the embodiments. With respect to the sizes, materials, shapes and relative positions of the constituent components, in particular, the patent specification is not intended to limit the scope of the present disclosure to those disclosed in the embodiments, unless otherwise specifically noted. The sizes of and the positional relationships between the members shown in the drawings might be exaggerated for clarification of the explanations. Furthermore, in the explanations below, the same designations and reference numerals denote the same or similar members for which the detailed explanations will be omitted when appropriate.

Embodiment 1

The light emitting device 1000 according to Embodiment 1 of the present disclosure will be explained based on FIG. 1, FIG. 2A, FIG. 2B, and FIG. 3A to FIG. 3C. The light emitting device 1000 includes: a light emitting element 40;

a first lead 20A including a wide-width portion 21A on which the light emitting element 40 is mounted, a narrow-width portion 22A extending from the wide-width portion and narrower than the wide-width portion 21A, and a terminal portion 23A extending from the narrow-width portion 22A and being wider than the narrow-width portion 22A; a second lead 20B electrically connected to the light emitting element 40; a resin member 10 supporting the first lead 20A and the second lead 20B, and including projected portions 11; and a resin frame 50 surrounding the light emitting element 40 and covering at least a portion of the projected portions 11. The projected portions 11 of the resin member 10 are at least partially surrounded by the wide-width portion 21A, the narrow-width portion 22A, and the terminal portion 23A.

According to this embodiment of the present disclosure, a light emitting device with improved adhesion between the resin frame and the base material can be provided.

Figure 2A:
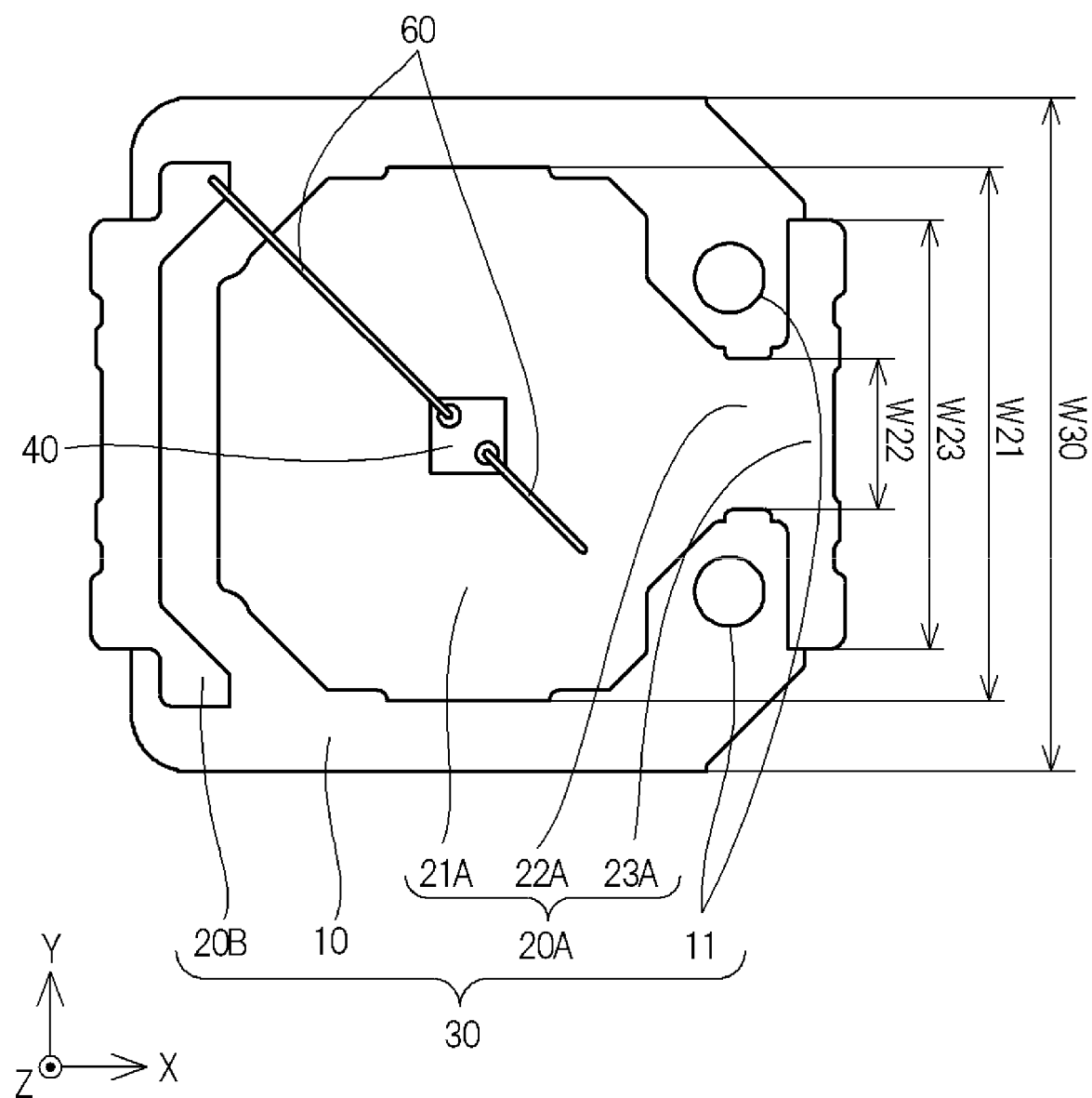
FIG. 2A is a top view of the light emitting device according to Embodiment 1 of the present disclosure in which a resin frame and a encapsulating member are omitted.
Figure 3A:
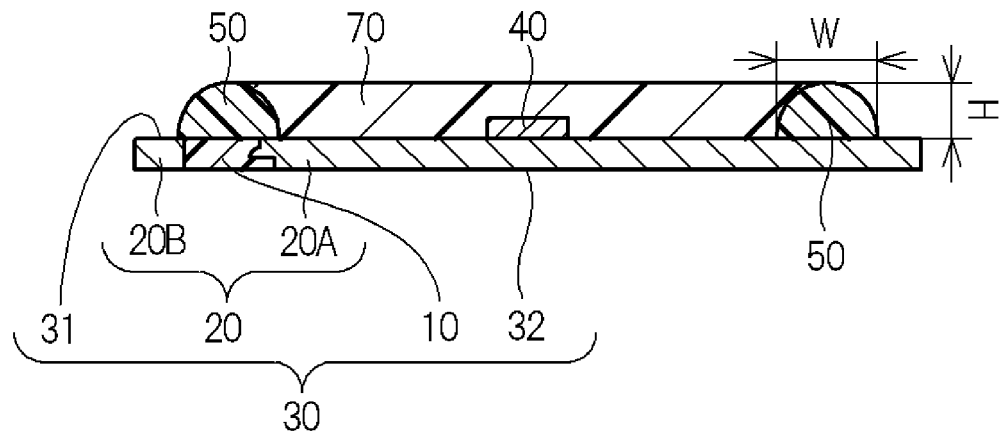
FIG. 3A is a sectional view taken along line A-A indicated in FIG. 1.
Figure 3B:
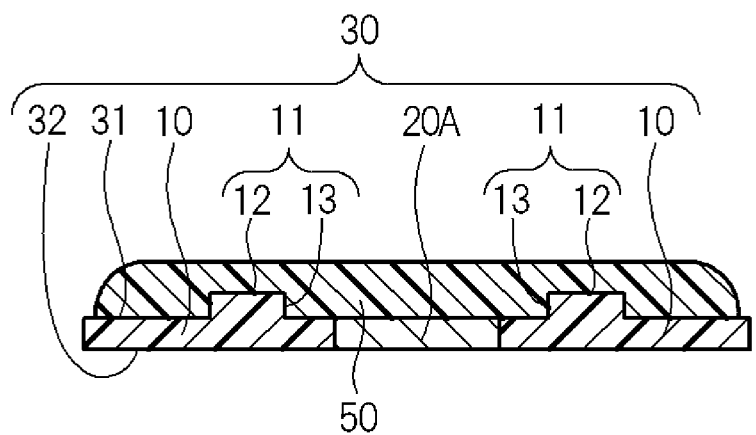
FIG. 3B is a sectional view taken along line B-B indicated in FIG. 1.

As shown in FIG. 3A, the base body 30 includes a first surface 31 and a second surface 32 on the opposite side of the first surface 31. As shown in FIG. 1, the base body 30 includes a conductive member 20 and the resin member 10. The conductive member 20 includes the first lead 20A and the second lead 20B. The resin member 10 supports the first lead 20A and the second lead 20B. As shown in FIG. 2A, the first lead 20A includes the wide-width portion 21A, the narrow-width portion 22A, and the terminal portion 23A. The light emitting element 40 is placed on the wide-width portion 21A. The narrow-width portion 22A extends from the wide-width portion 21A to be spaced apart from the light emitting element 40. A width W22 of the narrow-width portion 22A is smaller than a width W21 of the wide-width portion 21A. The terminal portion 23A extends from the narrow-width portion 22A. The width W23 of the terminal portion 23A is larger than the width 22 of the narrow-width portion 22A. The width W21 of the wide-width portion 21A, the width W22 of the narrow-width portion 22A, and the width W23 of the terminal portion 23A are the lengths of the first lead 20A in a direction perpendicular to a direction in which the narrow-width portion 22A extends from the wide-width portion 21A. As shown in FIG. 3B, the resin member 10 includes projected portions 11 on the first surface 31. The projected portions 11 are provided in locations such that they are at least partially surrounded by the wide-width portion 21A, the narrow-width portion 22A, and the terminal portion 23A. As shown in FIG. 1, the resin frame 50 surrounds the light emitting element 40, and covers at least a portion of each of the projected portions 11.

The adhesion between the resin member 10 and the resin frame 50 each containing a resin material is generally higher than the adhesion between the resin frame 50 and the conductive member 20, which does not substantially contain resin. This is because a thermal expansion coefficients of the resin member 10 and the resin frame 50 both containing a resin can be made closer. By increasing a contact area between the resin member 10 and the resin frame 50 where there is good adhesion, the adhesion between the resin frame 50 and the base body 30 can be efficiently improved. In the light emitting device 1000, the resin member 10 has projected portions 11, and the projected portions 11 are covered by the resin frame 50. Thus, the contact area between the resin member 10 and the resin frame 50 can be increased as compared to the instance in which the resin member 10 includes no projected portions 11. In this manner, an adhesion between the resin frame 50 and the base body 30 can be improved.

The projected portions 11 are disposed at the locations that are surrounded by the wide-width portion 21A, the narrow-width portion 22A, and the terminal portion 23A. It is not required to surround the entire perimeter of each projected portion 11 with the wide-width portion 21A, the narrow-width portion 22A, and the terminal portion 23A. For example, as shown in FIG. 2A, the first lead 20A does not have to be present at an area of the resin member 10 on the projected portion 11 side opposite from the narrow-width portion 22A side. Positioning each of the projected portion 11 to be surrounded by the wide-width portion 21A, the narrow-width portion 22A, and the terminal portion 23A situates the projected portion 11 between the wide-width portion 21A and the terminal portion 23A. Accordingly, a width W30 need not be broadened. For example, the width W30 of the base body 30 is less likely to be broadened if each of the projected portions 11 is formed in an outer area of the narrow-width portion 22A in the direction perpendicular to the direction in which the narrow-width portion 22A extends from the wide-width portion 21A, as compared to forming each of the projected portion 11 in an outer area of the wide-width portion 21A and/or the terminal portion 23A in the direction perpendicular to the direction in which the narrow-width portion 22A extends from the wide-width portion 21A. This makes it easy to miniaturize the light emitting device. The width W30 of the base body 30 is a length of the base body 30 in the direction perpendicular to the direction in which the narrow-width portion 22A extends from the wide-width portion 21A.

It is preferable to dispose a projected portion 11 to be spaced apart from the wide-width portion 21A and the terminal portion 23A. Because this can increase the contact area between the resin frame 50 and the resin member 10, the adhesion between the resin frame 50 and the base body 30 can be improved.

Figure 4A:
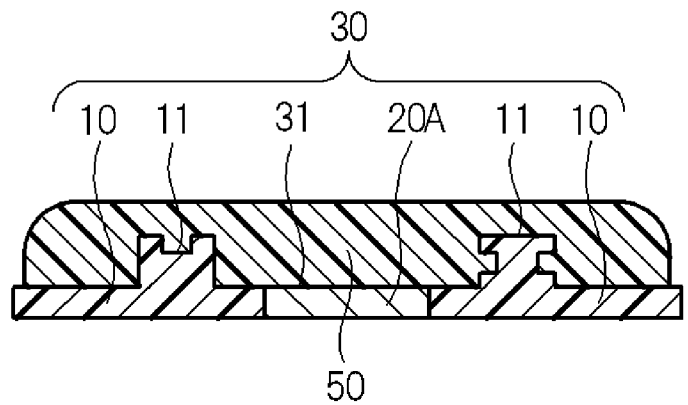
FIG. 4A is a variation of the light emitting device according to Embodiment 1 of the present disclosure.

In the light emitting device 1000, the projected portions 11 are cylindrical in shape. A cylindrical shape simplifies the molding of the projected portions 11. The projected portions 11, however, can have any shape, including a semispherical shape, a conic shape, pyramids such as a trigonal, quadrangular, or pentagonal pyramid, and prisms such as a triangular, quadrangular, or pentagonal prism. As shown in FIG. 4A, moreover, the surfaces of the projected portions 11 covered by the resin frame 50 can have projections and depressions. This can achieve a larger contact area between the projected portions 11 and the resin frame 50 than the case of not providing the surfaces of the projected portions 11 with any projections or depressions, thereby improving the adhesion between the resin frame 50 and the base body 30.

When the projected portions 11 have an upper surfaces 12 and a plurality of lateral surfaces 13, as shown in FIG. 3B, it is preferable for the resin frame 50 to cover both the upper surfaces 12 and the lateral surfaces 13 of the projected portions 11. Covering the upper surfaces 12 and the lateral surfaces 13 of the projected portions 11 with the resin frame 50 can achieve larger contact areas than in the case where only the lateral surfaces 13 of the projected portions 11 are covered with the resin frame 50, thereby improving the adhesion between the resin frame 50 and the base body 30.

Figure 2B:
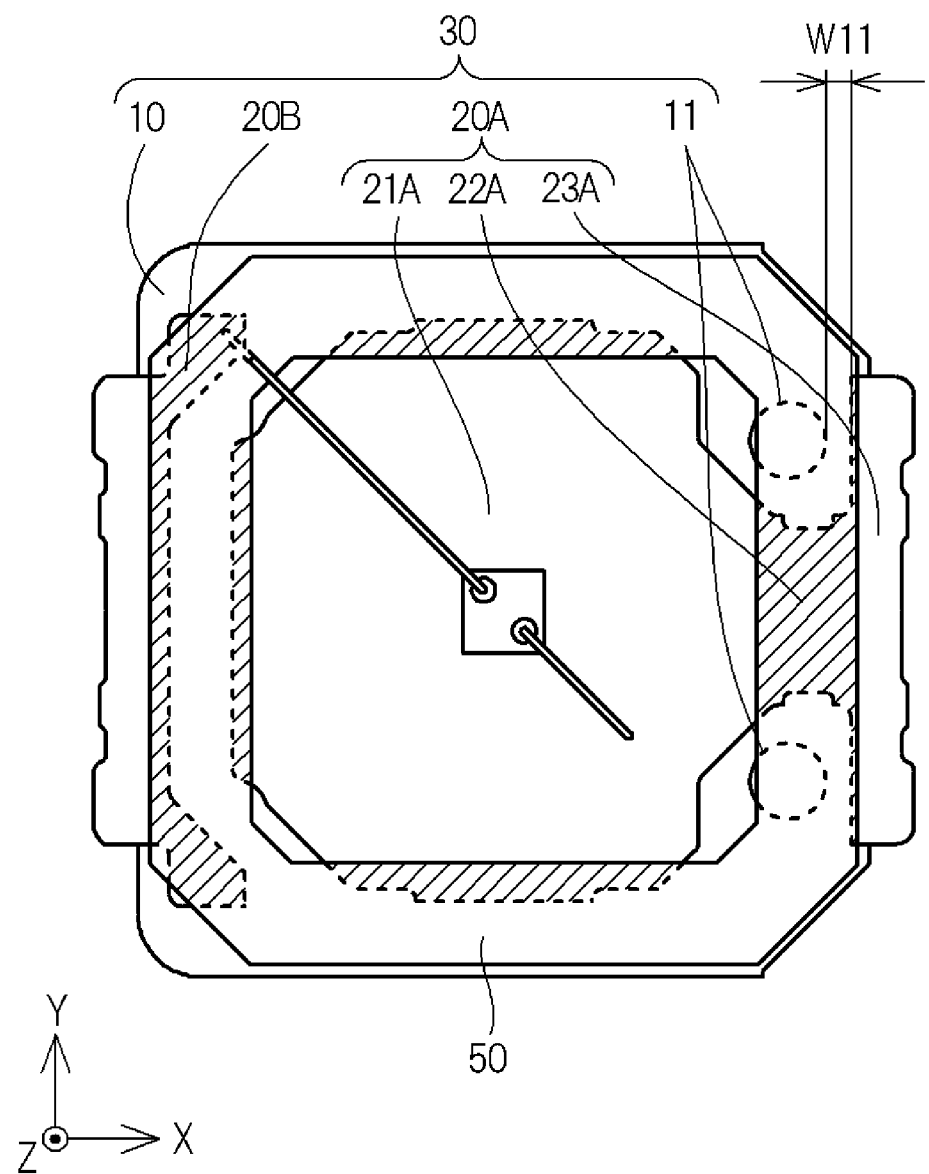
FIG. 2B is a top view of the light emitting device according to Embodiment 1 of the present disclosure in which the encapsulating member is omitted.

In FIG. 2B, hatching represents portions of the conductive member 20 that are covered by the resin frame 50. The shortest distance W11 between a portion of the resin frame 50 covering the first lead 20A and one of portions of the resin frame 50 covering the projected portions 11 is preferably no more than 1 mm. The adhesion between the resin frame 50 and the base body 30 can be enhanced by positioning the projected portions 11, which have good adhesion with the resin frame 50, near the conductive member 20, which has poor adhesion with the resin frame 50.

It is also preferable for the shortest distance W11 between the portion of the resin frame 50 covering the first lead 20A and one of the portions of the resin frame 50 covering the projected portions 11 to be shorter than a width of the resin frame 50. In this manner, the adhesion between the resin frame 50 and the base body 30 can be improved. The width of the resin frame 50 herein is the shortest distance between an inner perimeter and an outer perimeter of the resin frame 50.

The number of the projected portions 11 can be one or plural. Providing a plurality of projected portions 11 can increase the contact areas between the projected portions 11 and the resin frame 50, thereby improving the adhesion between the resin frame 50 and the base body 30. As shown in FIG. 2B and FIG. 3B, the resin member 10 in the light emitting device 1000 includes two projected portions 11. The first lead 20A is present between the two projected portions 11, and the resin frame 50 is arranged to span from one projected portion 11 to the other projected portion 11. Positioning the projected portions 11, which have good adhesion with the resin frame 50, on both sides of the first lead 20A, which has poor adhesion with the resin frame 50, can improve the adhesion between the resin frame 50 and the base body 30.

A height of a projected portion 11 is preferably at least 0.4 times, but less than one times a height of the resin frame 50. By providing the projected portion 11 with at least 0.4 times the height of the resin frame 50, the areas of the lateral surfaces 13 of the projected portion 11 can be increased. This can increase the contact areas between the lateral surfaces 13 of the projected portion 11 and the resin frame 50, thereby improving the adhesion between the projected portion 11 and the resin frame 50. By providing the projected portion 11 with less than one times the height of the resin frame 50, the resin frame 50 can cover the upper surface 12 of the projected portion 11. This can increase the contact areas between the projected portion 11 and the resin frame 50, thereby improving the adhesion between the projected portion 11 and the resin frame 50. Even when the projected portion 11 has a pyramidal shape, by having less than one times the height of the resin frame 50, an apex of the projected portion 11 can be covered. Thus, the contact areas between the projected portion 11 and the resin frame 50 can be increased.

Figure 4B:
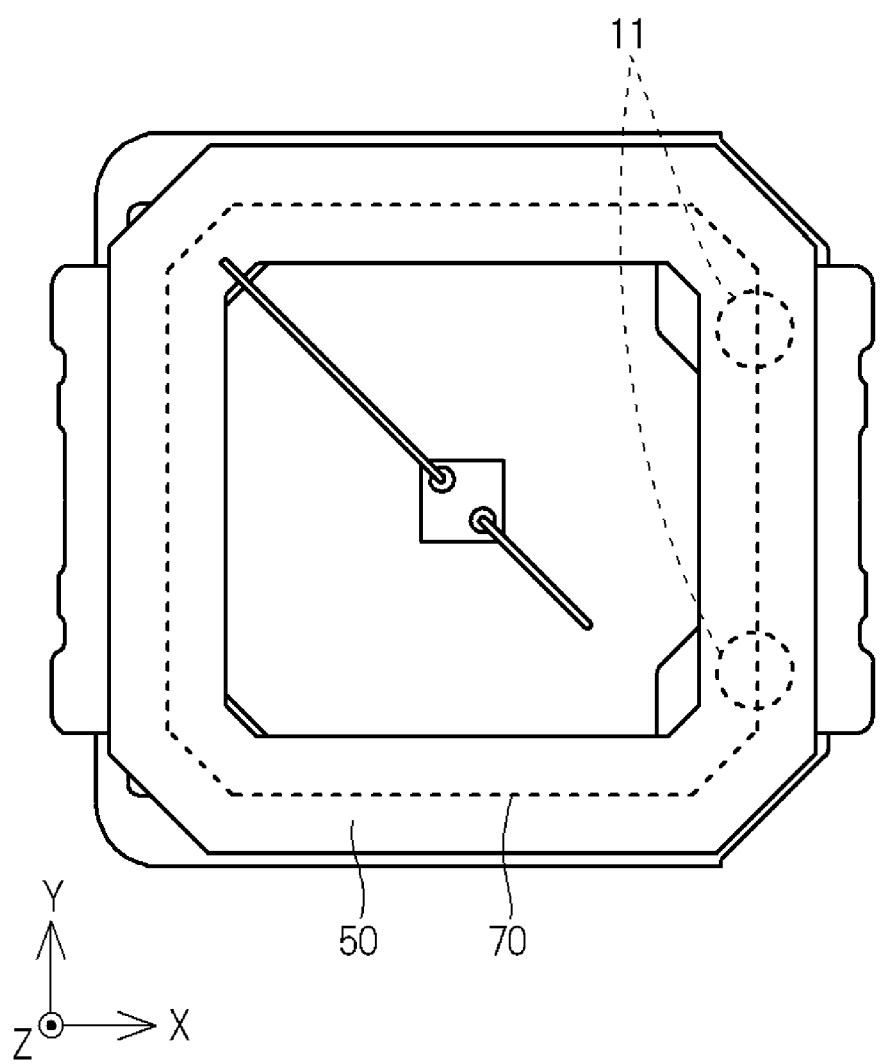
FIG. 4B is a variation of the light emitting device according to Embodiment 1 of the present disclosure.

As shown in FIG. 4B, it is preferable for the resin frame 50 to entirely cover the surfaces of the projected portions 11. Since this can increase the contact areas between the projected portions 11 and the resin frame 50, the adhesion between the projected portions 11 and the resin frame 50 can be enhanced. The height of the projected portion 11 refers to the longest length of the projected portion 11 in a z direction.

The reflectance of the resin frame 50 for the peak wavelength of the light emitted by the light emitting element 40 is preferably higher than the reflectance of the resin member 10 for the peak wavelength of the light emitted by the light emitting element 40. This makes it easier for the resin frame 50 to reflect the light from the light emitting element 40, thereby increasing the light extraction efficiency of the light emitting device.

Figure 3C:
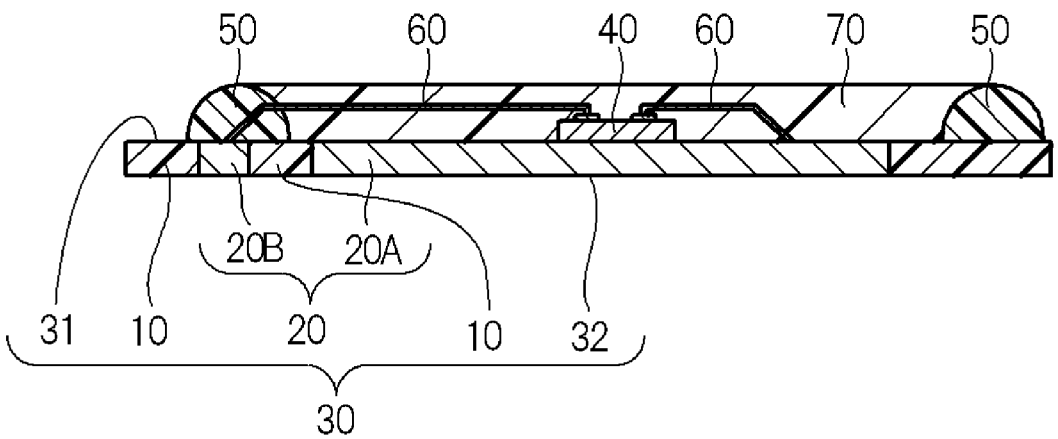
FIG. 3C is a sectional view taken along line C-C indicated in FIG. 1.

As shown in FIG. 3C, the light emitting element 40 and the second lead 20B are electrically connected by a wire 60. A junction between the wire 60 and the second lead 20B is preferably covered by the resin frame 50. This can discourage or prevent the wire 60 from absorbing the light from the light emitting element 40.

As shown in FIG. 2B, the resin frame 50 is arranged across the narrow-width portion 22A. This can achieve a larger contact area between the resin frame 50 and the resin member 10 than in the case where the resin frame 50 spans across the wide-width portion 21A and/or the terminal portion 23A, thereby improving the adhesion between the resin frame 50 and the base body 30.

The inner perimeter and the outer perimeter of the resin frame 50 in a top view can take any shape, including a circular shape, an elliptical shape, a polygon such as a square, hexagon, octagon, or any polygon with chamfered corners. Particularly, as shown in FIG. 1, the shapes of the inner perimeter and the outer perimeter of the resin frame 50, which are quadrangular shapes with chamfered corners are preferable. Chamfering the corners of the inner perimeter of the resin frame 50 allows for an uncured encapsulating resin 70 discussed later to easily fill the corner portions of the resin frame 50.

The resin frame 50 has a convex cross section with a rounded top. The resin frame 50 with curved interior and exterior surfaces can be formed by providing a syringe holding an uncured resin frame material inside, followed by discharging the uncured resin frame material from a through hole of the needle attached to the syringe.

As shown in FIG. 3A, the height H of the resin frame 50 is preferably greater than the height of the light emitting element 40. This allows for the encapsulating member 70 formed in the resin frame 50 to readily cover the upper surface of the light emitting element 40. Moreover, the width W of the resin frame 50 is preferably in a range between 0.2 and 5 times the height H of the resin frame 50. A width W of the resin frame 50 smaller than 0.2 times the height H of the resin frame 50 would decrease the strength of the resin frame 50. A width W of the resin frame 50 larger than 5 times the height H of the resin frame 50 would position the resin frame 50 close to the light emitting element 40 making it more likely for the resin frame to absorb a portion of the light from the light emitting element 40. The height H of the resin frame 50 herein is the greatest length of the resin frame 50 in the z direction, and the height of the light emitting element 40 is the greatest length of the light emitting element 40 in the z direction.

A plating layer may be formed on the surface of the resin frame 50. The plating layer can be composed of one, two or more metals, such as silver, aluminum, copper, and gold. The plating layer is preferably formed of silver, and the plating layer may be silver in its entirety. This can increase the light extraction efficiency of the light emitting device.

The encapsulating member 70 is disposed in the area surrounded by the resin frame 50 and encapsulates the light emitting element 40. This can protect the light emitting element 40. In the case where a protective film is formed on the surface of the light emitting element 40, the encapsulating member 70 may encapsulate the light emitting element 40 via the protective film.

Figure 4C:
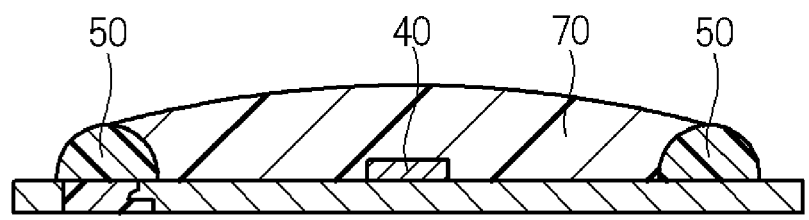
FIG. 4C is a variation of the light emitting device according to Embodiment 1 of the present disclosure.

The encapsulating member 70, as shown in FIG. 4C, is preferably formed such that the height in a central portion is greater than a peripheral portion. A convex shape with the thicker central portion than the peripheral portion reduces reflection of the light from the light emitting element 40 at the interface between the encapsulating member 70 and air, thereby increasing the light extraction efficiency. The convex encapsulating ember 70 having a thicker central portion than the peripheral portion can be formed by a dripping method.

Figure 4D:
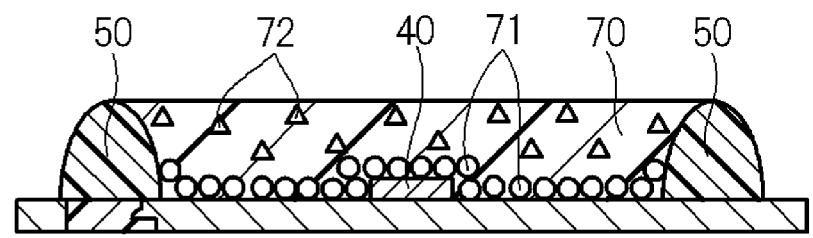
FIG. 4D is a variation of the light emitting device according to Embodiment 1 of the present disclosure.

As shown in FIG. 4D, the encapsulating member 70 can contain a wavelength conversion material 71. The wavelength conversion material 71 is a member that converts the light of a first peak wavelength emitted by the light emitting element 40 into light of a second peak wavelength which is different from the first peak wavelength. By allowing the encapsulating member 70 to contain the wavelength conversion material 71, mixed-color light which combines the light emitted by the light emitting element 40 having the first peak wavelength and the light emitted by the wavelength conversion material 71 having the second peak wavelength can be output. For example, employing a blue LED for the light emitting element 40 and employing a phosphor such as YAG phosphor for the wavelength conversion material 71 can construct a light emitting device which outputs white light resulting from mixing the blue light emitted by the blue LED and the yellow light emitted by the phosphor after being excited by the blue light.

The wavelength conversion material 71 can be uniformly dispersed or localized in the encapsulating member 70. The wavelength conversion material 71 may be localized in the vicinity of the light emitting element 40 rather than the upper surface of the encapsulating member 70. In this manner, even when using a wavelength conversion member 71 that is vulnerable to moisture, the encapsulating member 70 can concurrently function as a protective layer to reduce the degradation of the wavelength conversion material 71. Examples of wavelength conversion substances that are vulnerable to moisture include fluoride-based phosphors such as KSF-based phosphors, sulfide-based phosphors, chloride-based phosphors, silicate-based phosphors, and phosphate-based phosphors.

As shown in FIG. 4D, the encapsulating member 70 can contain a light diffusing material 72. Having a different refractive index than that of the encapsulating member 70, the light diffusing material 72 allows the light from the light emitting element 40 to be diffused by way of reflection and/or refraction. This can reduce non-uniform luminance occurring within the encapsulating member 70. Color non-uniformity can be reduced in the case where the encapsulating member 70 contains a wavelength conversion member 71 and a light diffusing material 72.

Figure 4E:
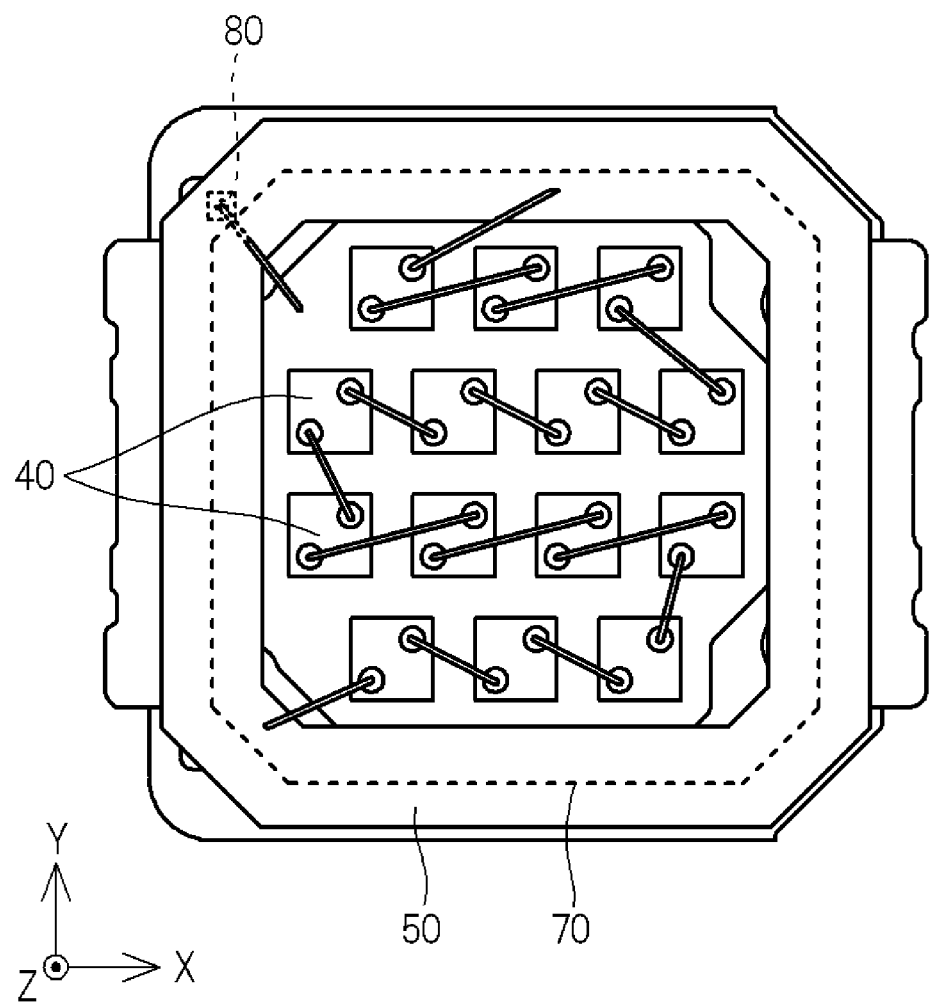
FIG. 4E is a variation of the light emitting device according to Embodiment 1 of the present disclosure.

In the light emitting device 1000, only one light emitting element 40 is provided, but a plurality of light emitting elements 40 may be arranged as shown in FIG. 4E. In the case of the plurality of light emitting elements 40, they can be mounted on both the first lead 20A and the second lead 20B, or all of them can be mounted on the first lead 20A. It is preferable to mount the plurality of light emitting elements 40 only on the first lead 20A because that can reduce the distance between the light emitting elements 40 thereby facilitating miniaturization. Moreover, the shortened distances between individual ones of the plurality of light emitting elements 40 can reduces wire breakage when using wires 60 for electrical connection between individual ones of the light emitting elements 40.

As shown in FIG. 4E, a protective device 80 may be mounted on the base body 30. There may be one or plural protective devices 80. For the protective device 80, any known device that is mounted on a light emitting device can be used.

As shown in FIG. 4E, the protective device 80 is preferably covered partially or entirely by the resin frame 50. This can discourage or prevent the protective device 80 from absorbing the light from the light emitting elements 40. By forming the resin frame 50 with a material having a higher reflectance relative to the peak wavelength of the light emitted by the light emitting elements 40 than that of the protective device 80, the light extraction efficiency of the light emitting device can be increased.

Embodiment 2

Figure 5A:
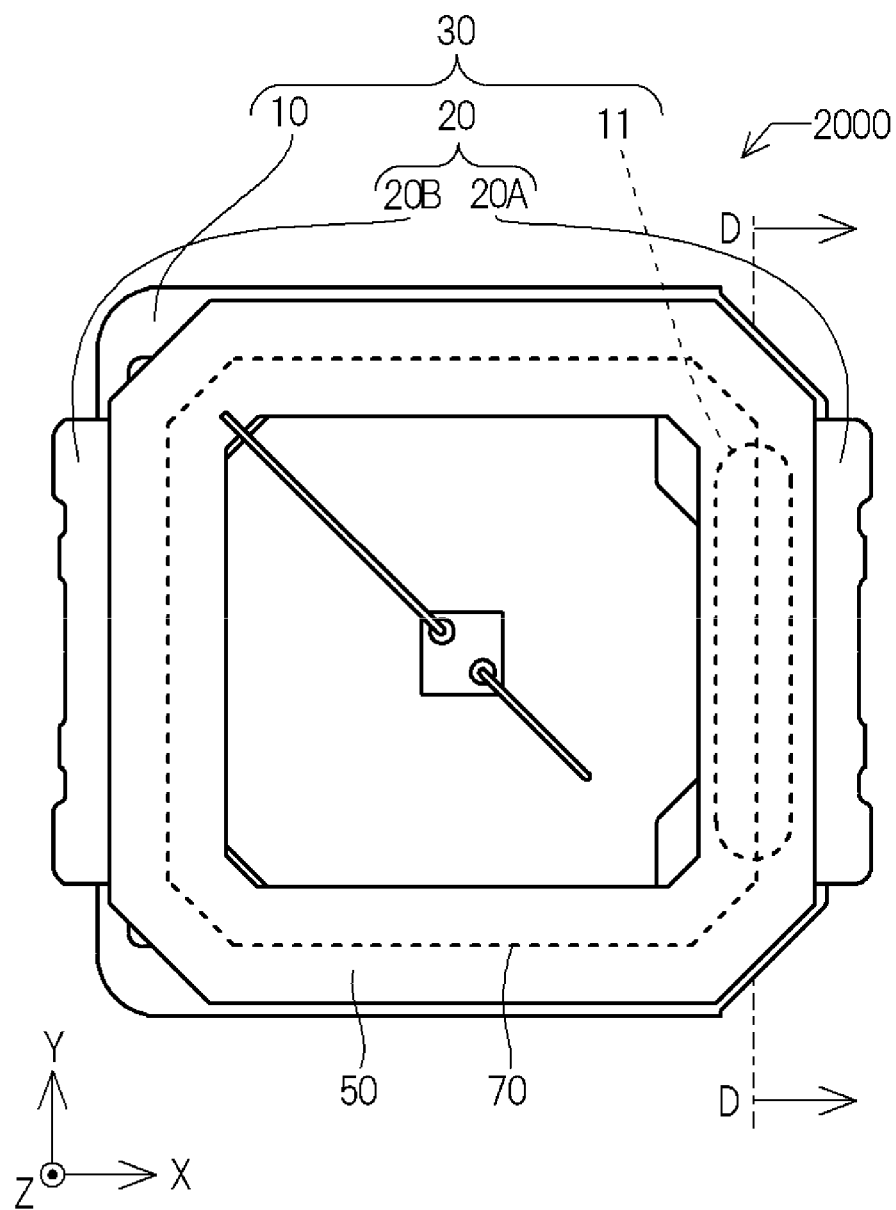
FIG. 5A is a top view of the light emitting device according to Embodiment 2 of the present disclosure.
Figure 5B:
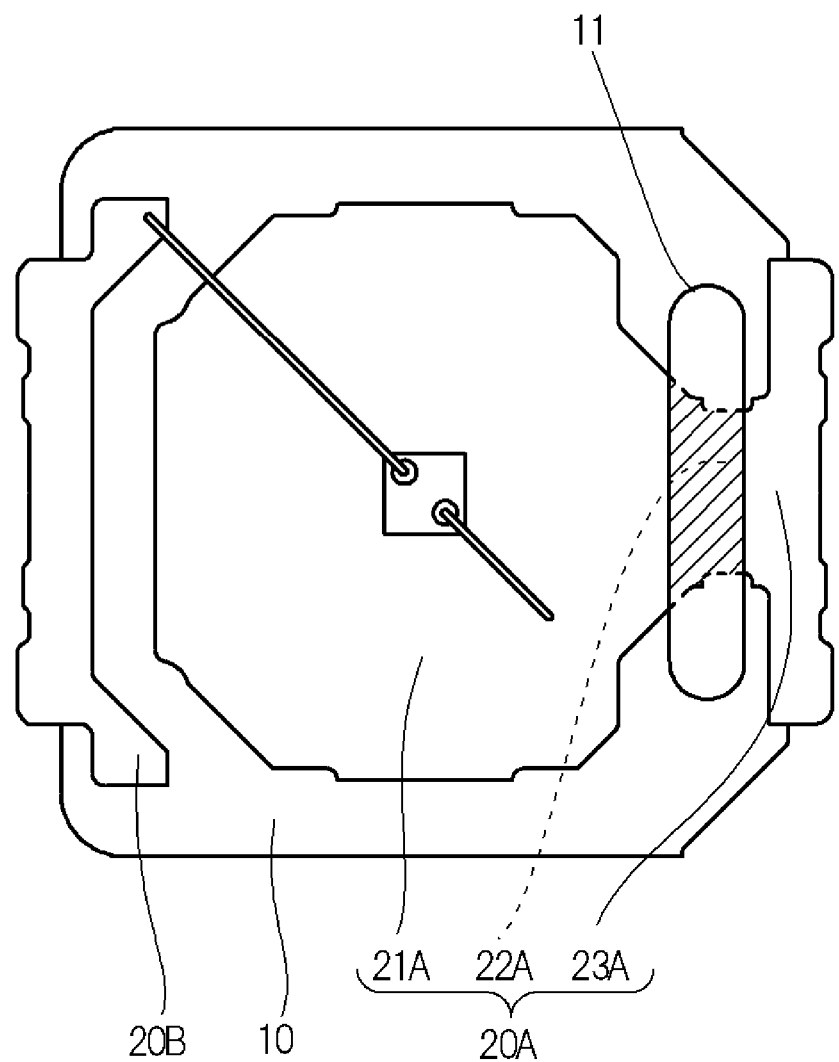
FIG. 5B is a top view of a light emitting device according to Embodiment 2 of the present disclosure in which a resin frame and a encapsulating member are omitted.
Figure 5C:
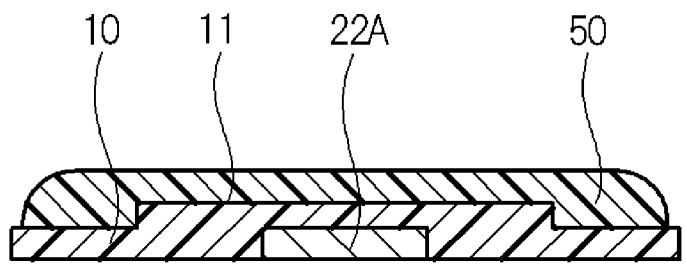
FIG. 5C is a sectional view taken along line D-D indicated in FIG. 5.

The light emitting device 2000 according to Embodiment 2 of the present disclosure shown in FIG. 5A to FIG. 5C differs from the light emitting device 1000 according to Embodiment 1 in terms of the shape of the projected portion 11. The other features are similar to those in Embodiment 1.

In FIG. 5B, hatching represents a portion of the conductive member 20 covered by the projected portion 11. As shown in FIG. 5B and FIG. 5C, the projected portion 11 is positioned to be at least partially surrounded by the wide-width portion 21A, the narrow-width portion 22A, and the terminal portion 23A, while covering the narrow-width portion 22A. By covering the narrow-width portion 22A with the projected portion 11, the contact area between the resin frame 50 and the resin member 10 can be increased. This can improve the adhesion between the resin frame 50 and the base body 30.

It is preferable for the projected portion 11 to extend in the direction perpendicular to the direction in which the narrow-width portion 22A extends from the wide-width portion 21A to cover the narrow-width portion 22A. In this manner, the area of the projected portion 11 that covers the first lead 20A can be reduced. This can also increase the contact area between the resin frame 50 and the resin member 10, thereby improving the adhesion between the resin frame 50 and the base body 30. The projected portion 11 of the resin member 10 may be disposed across the first lead 20A. In this manner, the resin member 10 is formed to surround the upper surface and the lateral surfaces of the first lead 20A. Thus, the adhesion between the first lead 20A and the resin member 10 can be improved.

Moreover, it is preferable for the projected portion 11 to be spaced apart from the wide-width portion 21A and the terminal portion 23A. Forming a projected portion 11 that covers the wide-width portion 21A and/or the terminal portion 23A would locate the projected portion 11 on the upper surface of the wide-width portion 21A and/or the terminal portion 23A. For this reason, the resin frame 50 readily covers the wide-width portion 21A and/or the terminal portion 23A. This can easily increase the contact areas between the resin frame 50 and the conductive member 20 because the wide-width portion 21 and the terminal portion 23A are larger in width than the narrow-width portion 22A. Accordingly, by positioning the projected portion 11 spaced apart from the wide-width portion 21A and the terminal portion 23A, the contact area between the resin frame 50 and the resin member 10 can be increased, and the adhesion between the resin frame 50 and the base body 30 can thus be improved.

Embodiment 3

Figure 6A:
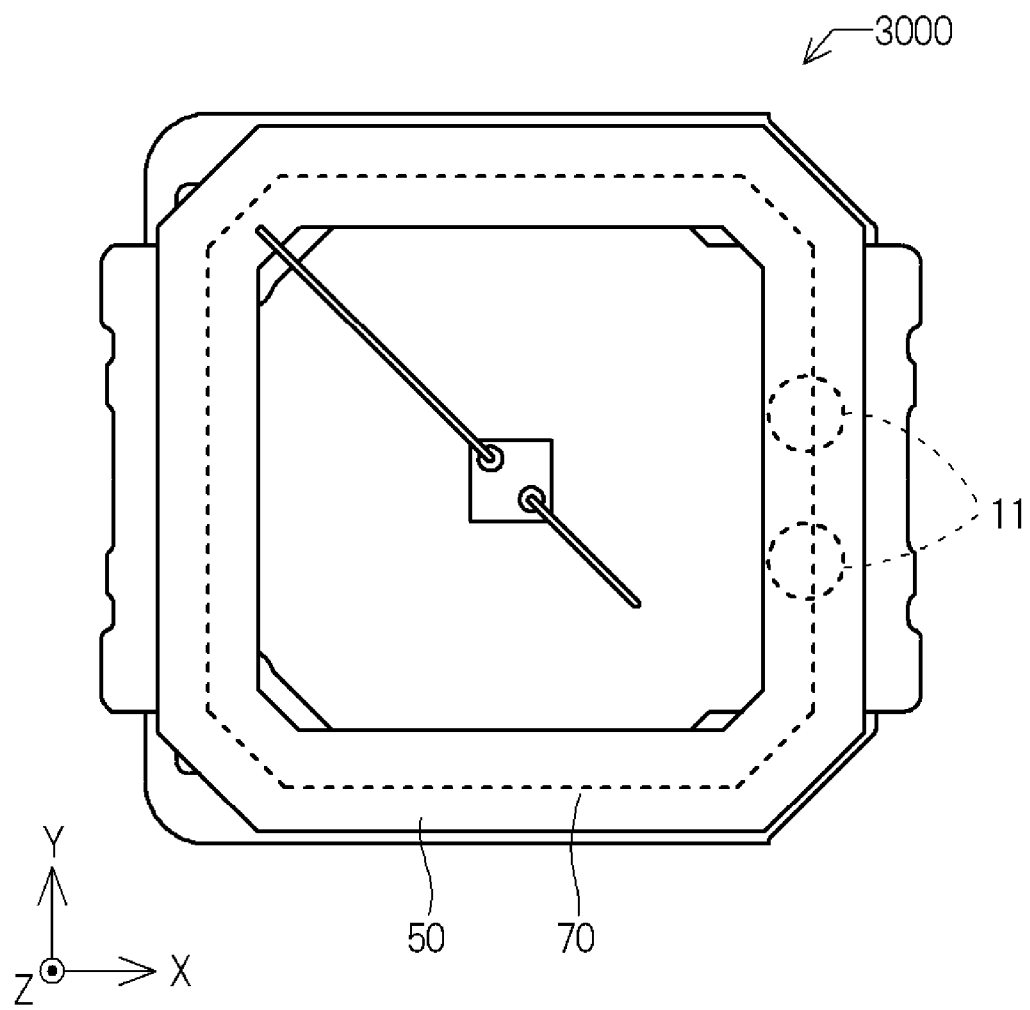
FIG. 6A is a top view of a light emitting device according to Embodiment 3 of the present disclosure.
Figure 6B:
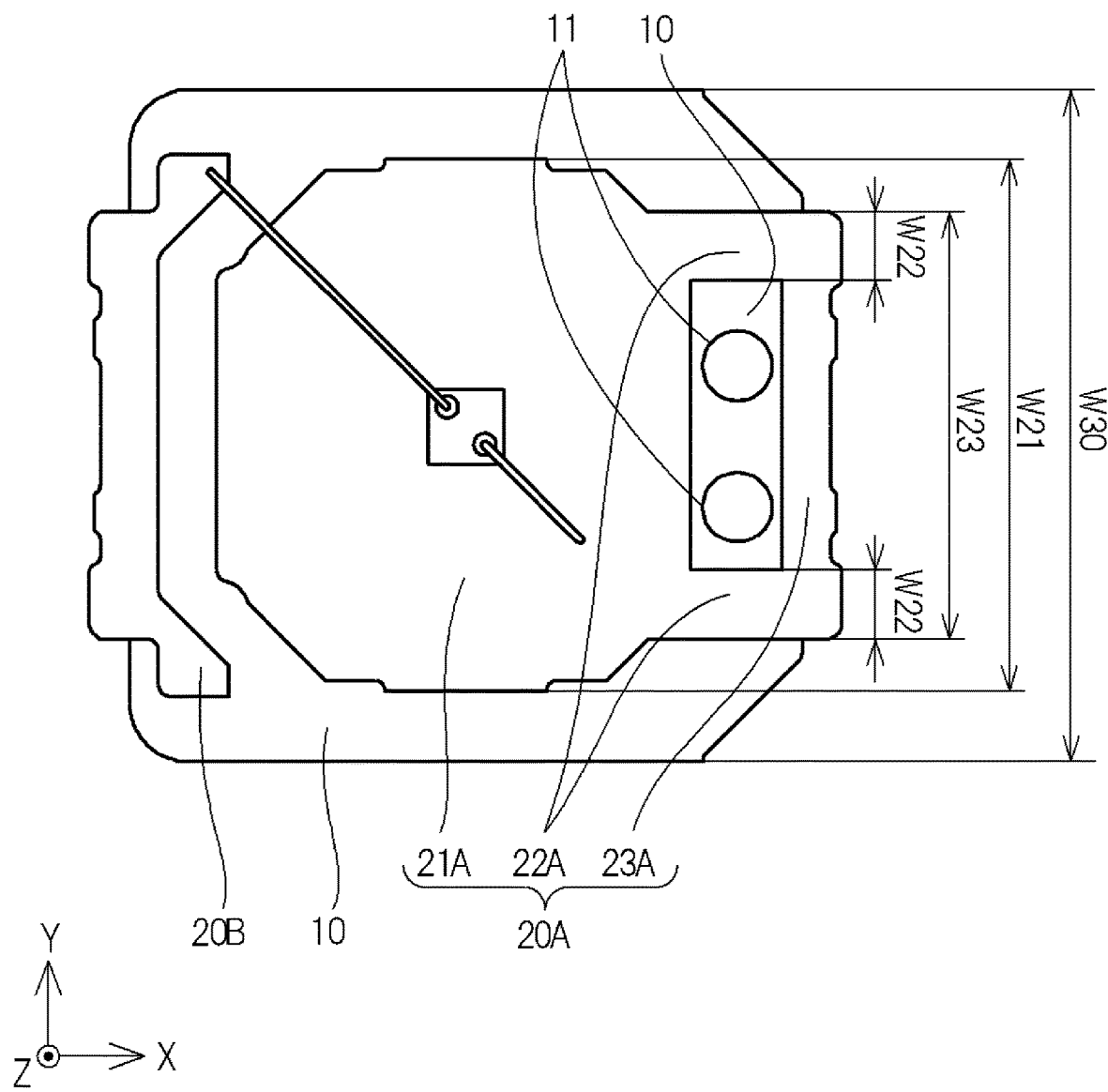
FIG. 6B is a top view of the light emitting device according to Embodiment 3 of the present disclosure in which a resin frame and a encapsulating member are omitted.

The light emitting device 3000 according to Embodiment 3 of the present disclosure shown in FIG. 6A and FIG. 6B is different from the light emitting device 1000 according to Embodiment 1 in terms of the shape of the conductive member 20 and the positions of the projected portions 11.

As shown in FIG. 6B, at least a portion of each projected portion 11 is present at the location that is surrounded by the wide-width portion 21A, the narrow-width portion 22A, and the terminal portion 23A, and the first lead 20A can have two narrow-width portions 22A. In this case, it is preferable to position the projected portions 11 between one narrow-width portion 22A and the other narrow-width portion 22A. In this manner, the projected portions 11, which have good adhesion with the resin frame 50, can improve the adhesion between the resin frame 50 and both of the narrow-width portions 22A. Furthermore, the lateral surfaces of the resin member 10 in at least one portion thereof may be entirely surrounded by the wide-width portion 21A, the two narrow-width portions 22A, and the terminal portion 23A. Since the lateral surfaces of the resin member 10 in that portion are surrounded by the first lead 20A along the entire perimeter, an adhesion between the first lead 20A and the resin member 10 can be improved. In the light emitting device 3000, the projected portions 11 are present in the portion that is surrounded by the wide-width portion 21A, the narrow-width portions 22A, and the terminal portion 23A.

Suitable materials for each of the constituent members of the light emitting devices according to Embodiments 1-3 will be explained below.

Base Body 30

The base body 30 is a component on which electronic components such as a light emitting element and a protective device. The base body 30 includes the resin member 10 and the conductive member 20.

Resin Member 10

Examples of materials for the resin member 10 includes epoxy resins, silicone resins, BT resins, polyamide resins, polyimide resins, nylon resins, and unsaturated polyester resins. These resin materials can contain coloring agents, fillers, reinforcing fibers, or the like that are known in the art. By using a white filler, such as titanium oxide or zinc oxide, as the coloring agent, the light extraction efficiency of the light emitting device can be increased. Moreover, by having the resin member contain a black filler, such as carbon black which has a high thermal emissivity, the heat from the light emitting element can be efficiently dissipated. Examples of fillers include silicon oxide and aluminum oxide. Examples of reinforcing fibers include glass, calcium silicate, and potassium titanate.

Conductive Member 20

The conductive member 20 is used to apply voltage from an external power supply to the electronic components such as the light emitting element 40. The conductive member 20 includes the first lead 20A and the second lead 20B. The conductive member 20 preferably has a plate shape having no portions that are bent in the z direction. A plate-shaped conductive member 20 simplifies the molding of the base body 30.

In a plan view, the area of the first lead 20A is preferably larger than the area of the second lead 20B. Since the light emitting element 40 is mounted on the first lead 20A, the first lead 20A having a large area can facilitate heat transfer from the light emitting element 40 to the first lead 20A. This can moderate the temperature rise in the light emitting element 40, thereby improving the reliability of the light emitting device.

The conductive member 20 may be projected from a lateral surface of the resin member 10. By increasing the volume of the conductive member 20, the heat dissipation of the light emitting device can be enhanced. Furthermore, the back surface of the first lead 20A directly below the light emitting element 40 is preferably exposed from the resin member 10. In the case where the bottom surface of the light emitting device is mounted on a mounting board, the heat generated at the light emitting element 40 can be readily transferred to the mounting board via the first lead 20A exposed from the resin member 10. This can moderate the temperature rise in the light emitting element 40, thereby improving the reliability of the light emitting device.

The conductive member 20 is preferably formed with a material having a relatively high thermal conductivity. For example, using a material having a thermal conductivity of at least about 200 W/mK, the heat generated at the light emitting element 40 can readily be transferred to the first lead 20A.

The conductive member 20 is preferably formed with a high strength material which can be easily processed by punching or cutting. For example, metals such as copper, aluminum, gold, silver, tungsten, iron, and nickel, alloys of these, phosphor bronze, or copper-iron alloys can be used as the base material in a single layer or a multi-layer.

The conductive member 20 may be provided with a light reflective film on the surface. For the light reflective film, one or more metals such as aluminum, copper, and gold can be used. Silver is particularly preferable for the light reflective film. The configuration as above can increase the light extraction efficiency of the light emitting device.

Various methods can be used to form the light reflective film on the conductive member 20, includes plating, vapor deposition, sputtering, and ion beam assisted vapor deposition. The film thickness can be any, as long as the light from the light emitting element 40 can be effectively reflected, and is, for example, in a range between about 20 nm and about 10 μm, preferably between about 50 nm and about 5 μm, more preferably between about 100 nm and about 3 μm. The thickness and the shape of the conductive member can be suitably set within the ranges that are known in the art.

In the case of using for the conductive member 20 silver which can be readily sulfurized, it is preferable to dispose a protective film on the surface of the conductive member 20. Providing a protective film moderates sulfurization of the conductive member 20 to lessen the decline of the light extraction efficiency of the light emitting device. For the protective film, an inorganic material, such as aluminum oxide and silicon oxide, can be used.

As shown in FIG. 3A, it is preferable for end surfaces of the first lead 20A and/or the second lead 20B to have a projection or depression.

By providing a projection or depression at the locations where the first lead 20A and/or the second lead 20B come into contact with the resin member 10, the contact area between the resin member 10 and the first lead 20A and/or the second lead 20B can be increased. This can improve the adhesion between the resin member 10 and the first lead 20A and/or the second lead 20B.

Light Emitting Element 40

The light emitting element 40 is placed on the first surface 31 of the first lead 20A. The light emitting element 40 is a semiconductor element which itself emits light when a voltage is applied, a known semiconductor element composed of a nitride semiconductor or the like can be used. The emission wavelength of the light emitting element can be selected from the ultraviolet region to the infrared region, including the visible region in a range between 380 and 780 nm. For the light emitting element having a peak emission wavelength in a range between 430 nm and 490 nm, a nitride semiconductor can be used, for example. For the nitride semiconductor, $In_xAl_yGa_{1-X-Y}N$ ($0 \leq X$, $0 \leq Y$, $X+Y \leq 1$), or the like can be used. The light emitting element 40 may be disposed on the first surface 31 via a submount.

The shape of the light emitting element 40, in a top view, can be any shape, including polygons such as triangle, square, and hexagon, or a shape similar to these. Moreover, the light emitting element 40 can be of a single-sided electrode structure in which an n-electrode and a p-electrode are formed on the same side, or of a double-sided electrode structure in which the n-electrode and the p-electrode are disposed on two opposite sides, for example, on the upper surface and the lower surface.

In the case of a light emitting element 40 of a single-sided electrode structure, it is mounted face up on the first surface 31 of the first lead 20A. In face-up mounting, the surface of the light emitting element 40, which is opposite the surface having the electrodes, is mounted on the base body 30. The bonding material used between the light emitting element 40 and the first lead 20A can be an insulating or conductive bonding material, and known bonding material can be used. For example, insulating bonding materials include epoxy resins, silicone resins or their modified resins, and conductive bonding materials include a conductive paste of silver, gold, or palladium, eutectic Au—Sn solder, and low melting point brazing filler metals.

In the case of a light emitting element 40 of a double-sided electrode structure, it suffices to employ a conductive bonding material between the light emitting element 40 and the first lead 20A, and a known bonding material can be used. For example, conductive bonding materials include a conductive paste of silver, gold, or palladium, eutectic Au—Sn solder, and low melting point brazing filler metals. In this case, by placing the light emitting element on the first lead 20A, the light emitting element 40 and the first lead 20A can be electrically connected.

Resin Frame 50

The resin frame 50 is disposed to surround the light emitting element 40 in an annular shape. Because the resin frame 50 surrounds the light emitting element 40, a material for the encapsulating member 70 in an uncured state can be retained in the resin frame 50. The resin frame 50 is formed by arranging the uncured material for the resin frame 50 in the desired location for forming the resin frame 50, followed by curing the material.

Examples of materials for the resin frame 50 include phenol resins, epoxy resins, BT resins, PPAs, and silicone resins. In particular, silicone resins is preferable for the material of the resin frame 50 due to its good light resistance. In such a base resin material, powder of a light reflective material, which does not readily absorb the light from the light emitting element 40 and has a large refractive index difference from the base resin material, can be contained to effectively reflect the light from the light emitting element 40. For the light reflective material, titanium oxide, aluminum oxide, zirconium oxide, or magnesium oxide can be used, for example. Titanium oxide is particularly preferable because it is relatively stable against moisture and has a high refractive index. The resin frame 50 is a member that has a reflectance of at least 60% for the light from the light emitting element 40, more preferably at least 70%. This makes it less likely for the resin frame 50 to absorb the light which reaches the resin frame 50, thereby increasing the light extraction efficiency of the light emitting device.

Wire 60

The light emitting element 40 and the second lead 20B may be electrically connected via a wire 60. A highly conductive metal material can be used for the wire 60. For the metal materials, gold, aluminum, copper, silver, or the like can be used. Any known wire bonding method, such as ball bonding and wedge bonding, can be used.

Encapsulating Member 70

For the encapsulating member 70, a light transmissive resin material or glass can be used. A resin material, in particular, is preferable for the encapsulating member 70. Since both the resin member 10 and the resin frame 50 contain a resin material, also employing a resin material for the encapsulating member 70 can improve the adhesion between the encapsulating member 70 and the resin member 10 as well as the adhesion between the encapsulating member 70 and the resin frame 50. For the resin material for the encapsulating member 70, polycarbonate resins, epoxy resins, phenol resins, silicone resins, acrylic resins, polymethylpentene resins, polynorbornene resins, their modified resins, or hybrid resins containing one or more of these resins can be used. For the encapsulating member 70, dimethyl silicone resins and phenyl silicone resins, in particular, are preferable due to their highly light resistant.

Wavelength Conversion Material 71

For the wavelength conversion material 71, phosphor particles excitable by the light emitted by the light emitting element are used. For example, phosphors excitable by a blue light emitting element or an ultraviolet light emitting element include cerium-activated yttrium aluminum garnet-based phosphors (YAG:Ce); cerium-activated lutetium aluminum garnet-based phosphors (LAG:Ce); europium and/or chromium-activated nitrogen-containing calcium aluminosilicate-based phosphors ($CaO-Al_2O_3-SiO_2$:Eu,Cr); europium-activated silicate-based phosphors (($Sr,Ba)_2SiO_4$:Eu); nitride-based phosphors, such as β-sialon-based phosphors, CASN-based phosphors, and SCASN-based phosphors; fluoride-based phosphors such as KSF-based phosphors; sulfide-based phosphors; chloride-based phosphors; silicate-based phosphors; phosphate-based phosphors; and quantum dot phosphors. By combining these phosphors and a blue or ultraviolet light emitting element, light emitting devices emitting light of various wavelengths can be manufactured.

Light Diffusing Material 72

For the light diffusing material 72, titanium oxide, zirconium oxide, aluminum oxide, silicon oxide, or the like can be used. Titanium oxide, in particular, is preferable because it is relatively stable against moisture and has a high refractive index.

Protective Device 80

Examples of the protective device 80 include a protective circuit and an electrostatic discharge protection device capable of stopping a reverse current flow when a reverse voltage is applied to the light emitting element 40, or stopping an overcurrent to flow to the light emitting element 40 when a forward voltage higher than the operating voltage of the light emitting element is applied. Specifically, a Zener diode can be used.

Certain embodiments of the present invention were described above as examples. It is, however, expressly noted that the present invention is not limited to these embodiments, but the principles of the present invention defined herein can be applied to other embodiments and applications without departing from the spirit and scope of the invention.

What is claimed is:

1. A light emitting device, comprising:
   one or more light emitting elements;
   a first lead on which the one or more light emitting elements are disposed;
   a second lead electrically connected to the one or more light emitting elements;
   a resin member supporting the first lead and the second lead, and including one or more projected portions projecting upward such that, in a cross-sectional view of the light emitting device, an upper surface of each of the one or more projected portions is at a position higher than upper surfaces of the first and second leads; and a resin frame surrounding the one or more light emitting elements, and covering at least a portion of each of the one or more projected portions, wherein, in a plan view of the light emitting device, the one or more projected portions are located outside of an area of the first lead.

2. The light emitting device according to claim 1, wherein the upper surface and a lateral surface of each of the one or more projected portions are covered by the resin frame.

3. The light emitting device according to claim 1, wherein a shortest distance between a portion of the first lead covered by the resin frame and said at least a portion of each of the one or more projected portions covered by the resin frame is shorter than a width of the resin frame.

4. The light emitting device according to claim 1, wherein a height of each of the one or more projected portions is at least 0.4 times, but less than one times a height of the resin frame.

5. The light emitting device according to claim 1, wherein the resin frame covers all surfaces of the one or more projected portions.

6. The light emitting device according to claim 1, wherein:
the one or more projected portions include a first projected portion and a second projected portion,
a part of the first lead is located between the first projected portion and the second projected portion, and
the resin frame is arranged to span from the first projected portion to the second projected portion.

7. The light emitting device according to claim 1, wherein a reflectance of the resin frame relative to a peak emission wavelength of the one or more light emitting elements is higher than a reflectance of the resin member relative to the peak emission wavelength of the one or more light emitting elements.

8. The light emitting device according to claim 1, wherein at least one of the one or more light emitting elements and the second lead are electrically connected by a wire, and a junction between the wire and the second lead is covered by the resin frame.

9. The light emitting device according to claim 1, wherein the resin frame contains a silicone resin.

10. A light emitting device, comprising:
one or more light emitting elements,
a first lead including:
  a wide-width portion on which the one or more light emitting elements are located,
  a narrow-width portion that extends from the wide-width portion and is narrower than the wide-width portion in a plan view of the light emitting device, and
  a terminal portion that extends from the narrow-width portion and is wider than the narrow-width portion in the plan view of the light emitting device;
a second lead electrically connected to the one or more light emitting elements;
a resin member supporting the first lead and the second lead, and including one or more projected portions projecting upward such that, in a cross-sectional view of the light emitting device, an upper surface of each of the one or more projected portions is at a position higher than upper surfaces of the first and second leads; and
a resin frame surrounding the one or more light emitting elements, and covering at least a portion of each of the one or more projected portions, wherein, in the plan view of the light emitting device, the one or more projected portions of the resin member are at least partially surrounded by the wide-width portion, the narrow-width portion, and the terminal portion, and wherein, in the plan view of the light emitting device, the one or more projected portions are located outside of an area of the wide-width portion of the first lead and an area of the terminal portion of the first lead.

11. The light emitting device according to claim 10, wherein the one or more projected portions are spaced apart from the wide-width portion and the terminal portion.

12. The light emitting device according to claim 10, wherein the one or more projected portions at least partially cover the narrow-width portion.

13. The light emitting device according to claim 10, wherein the upper surface and a lateral surface of each of the one or more projected portions are covered by the resin frame.

14. The light emitting device according to claim 10, wherein a shortest distance between a portion of the first lead covered by the resin frame and said at least a portion of each of the one or more projected portions covered by the resin frame is shorter than a width of the resin frame.

15. The light emitting device according to claim 10, wherein a height of each of the one or more projected portions is at least 0.4 times, but less than one times a height of the resin frame.

16. The light emitting device according to claim 10, wherein the resin frame covers all surfaces of the one or more projected portions.

17. The light emitting device according to claim 10, wherein:
the one or more projected portions include a first projected portion and a second projected portion,
a part of the first lead is located between the first projected portion and the second projected portion, and
the resin frame is arranged to span from the first projected portion to the second projected portion.

18. The light emitting device according to claim 10, wherein a reflectance of the resin frame relative to a peak emission wavelength of the one or more light emitting elements is higher than a reflectance of the resin member relative to the peak emission wavelength of the one or more light emitting elements.

19. The light emitting device according to claim 10, wherein at least one of the one or more light emitting elements and the second lead are electrically connected by a wire, and a junction between the wire and the second lead is covered by the resin frame.

20. The light emitting device according to claim 10, wherein the resin frame contains a silicone resin.

* * * * *